(12) United States Patent
Diaz et al.

(10) Patent No.: US 11,245,033 B2
(45) Date of Patent: Feb. 8, 2022

(54) SEMICONDUCTOR DEVICES WITH CORE-SHELL STRUCTURES

(71) Applicant: TAIWAN SEMICONDUCTOR MANUFACTURING CO., LTD., Hsinchu (TW)

(72) Inventors: Carlos H. Diaz, Mountain View, CA (US); Chun-Hsiung Lin, Zhubei (TW); Huicheng Chang, Tainan (TW); Syun-Ming Jang, Hsin-Chu (TW); Chien-Hsun Wang, Hsinchu (TW); Mao-Lin Huang, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 56 days.

(21) Appl. No.: 16/049,358

(22) Filed: Jul. 30, 2018

(65) Prior Publication Data

US 2018/0350984 A1 Dec. 6, 2018

Related U.S. Application Data

(62) Division of application No. 14/211,382, filed on Mar. 14, 2014, now Pat. No. 10,553,718.

(51) Int. Cl.
*H01L 29/423* (2006.01)
*H01L 29/78* (2006.01)
(Continued)

(52) U.S. Cl.
CPC .......... *H01L 29/7842* (2013.01); *B82Y 10/00* (2013.01); *H01L 21/02603* (2013.01); *H01L 29/068* (2013.01); *H01L 29/0665* (2013.01); *H01L 29/0669* (2013.01); *H01L 29/0673* (2013.01); *H01L 29/42392* (2013.01);
(Continued)

(58) Field of Classification Search
CPC .......... H01L 29/0673; H01L 29/42392; H01L 29/775; H01L 29/78696; H01L 29/66439; H01L 29/66795; H01L 29/785; H01L 21/02603; H01L 29/0669; H01L 29/7842; H01L 29/068; H01L 29/517;
(Continued)

(56) References Cited

U.S. PATENT DOCUMENTS 8,030,108 B1 10/2011 Lee et al.
8,609,481 B1 12/2013 Franklin et al.
(Continued)

OTHER PUBLICATIONS

Office Action dated Jun. 1, 2017, issued in Chinese Patent Application No. 201410315836.0.
(Continued)

*Primary Examiner* — David Chen
(74) *Attorney, Agent, or Firm* — McDermott Will & Emery LLP

(57) ABSTRACT

In a method of manufacturing a semiconductor device, a support layer is formed over a substrate. A patterned semiconductor layer made of a first semiconductor material is formed over the support layer. A part of the support layer under a part of the semiconductor layer is removed, thereby forming a semiconductor wire. A semiconductor shell layer made of a second semiconductor material different from the first semiconductor material is formed around the semiconductor wire.

20 Claims, 9 Drawing Sheets

(51) Int. Cl.
- *H01L 29/06* (2006.01)
- *H01L 29/66* (2006.01)
- *H01L 29/775* (2006.01)
- *H01L 29/778* (2006.01)
- *H01L 29/786* (2006.01)
- *B82Y 10/00* (2011.01)
- *H01L 21/02* (2006.01)
- *H01L 29/165* (2006.01)
- *H01L 29/51* (2006.01)

(52) U.S. Cl.
CPC .. *H01L 29/66431* (2013.01); *H01L 29/66795* (2013.01); *H01L 29/775* (2013.01); *H01L 29/7781* (2013.01); *H01L 29/7853* (2013.01); *H01L 29/78696* (2013.01); *H01L 29/0676* (2013.01); *H01L 29/165* (2013.01); *H01L 29/517* (2013.01); *H01L 29/518* (2013.01); *Y10S 977/938* (2013.01)

(58) Field of Classification Search
CPC . H01L 29/518; H01L 29/0676; H01L 29/165; B82Y 10/00
USPC .......... 438/151, 197, 283, 284; 257/24, 288, 257/E29.245, E29.255
See application file for complete search history.

(56) References Cited

U.S. PATENT DOCUMENTS

| | | | |
|---|---|---|---|
| 2004/0152272 | A1 | 8/2004 | Fladre et al. |
| 2006/0172497 | A1* | 8/2006 | Hareland .......... H01L 29/42384 438/286 |
| 2006/0216897 | A1* | 9/2006 | Lee ................. B82Y 10/00 438/282 |
| 2007/0045725 | A1* | 3/2007 | Yun ................. H01L 29/42392 257/330 |
| 2008/0064156 | A1 | 3/2008 | Ikeda |
| 2008/0093628 | A1* | 4/2008 | Lee ................. H01L 29/66484 257/190 |
| 2008/0135949 | A1* | 6/2008 | Lo ................. B82Y 10/00 257/401 |
| 2008/0298416 | A1 | 12/2008 | Chirovsky et al. |
| 2009/0283756 | A1 | 11/2009 | Hellings et al. |
| 2009/0289244 | A1 | 11/2009 | Pryor et al. |
| 2010/0176459 | A1 | 7/2010 | Wernersson et al. |
| 2011/0227040 | A1 | 9/2011 | Iwaki et al. |
| 2013/0020612 | A1 | 1/2013 | Wann et al. |
| 2014/0034905 | A1 | 2/2014 | Bangsaruntip et al. |
| 2014/0091279 | A1* | 4/2014 | Kachian .......... B82Y 10/00 257/27 |
| 2014/0151705 | A1* | 6/2014 | Xiao .............. B82Y 10/00 257/64 |
| 2015/0084041 | A1* | 3/2015 | Hur ................. H01L 29/7831 257/43 |
| 2015/0090958 | A1* | 4/2015 | Yang .............. H01L 29/0676 257/27 |
| 2015/0102287 | A1* | 4/2015 | Wang ............. H01L 29/0669 257/26 |

OTHER PUBLICATIONS

Office Action issued in corresponding Taiwan Patent Application No. 10621169780, dated Nov. 17, 2017.
Final Office Action dated Jul. 12, 2018 issued in U.S. Appl. No. 14/211,382 (22 pages).
Non-Final Office Action dated Dec. 14, 2017 issued in U.S. Appl. No. 14/211,382 (22 pages).
Final Office Action dated Jan. 11, 2017 issued in U.S. Appl. No. 14/211,382 (13 pages).
Palmer, D.W., Properties of the III-V Compound Semiconductors and Properties of Diamond, Silicon and Germanium (2014).
Non-Final Office Action dated Jul. 24, 2015 issued in U.S. Appl. No. 14/211,382 (15 pages).
Final Office Action dated Oct. 29, 2015 issued in U.S. Appl. No. 14/211,382 (15 pages).
Non-Final Office Action dated Jun. 22, 2016 issued in U.S. Appl. No. 14/211,382 (20 pages).
Non-Final Office Action dated Feb. 26, 2015 issued in U.S. Appl. No. 14/211,382 (9 pages).
Office Action dated Jan. 10, 2017 issued in Taiwan Patent Application No. 103146471 (7 pages).

\* cited by examiner

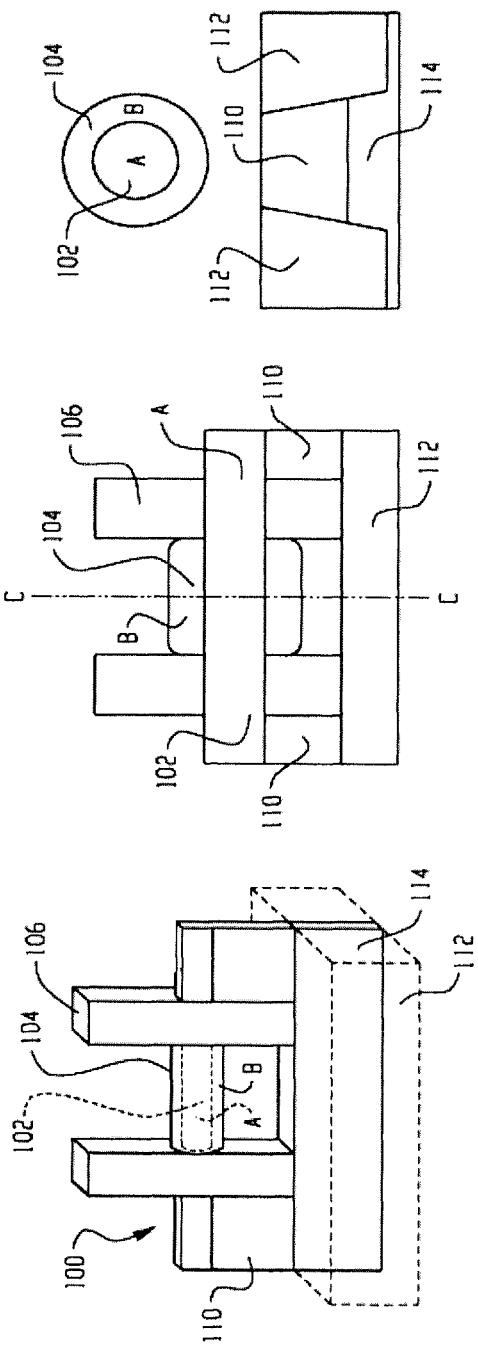

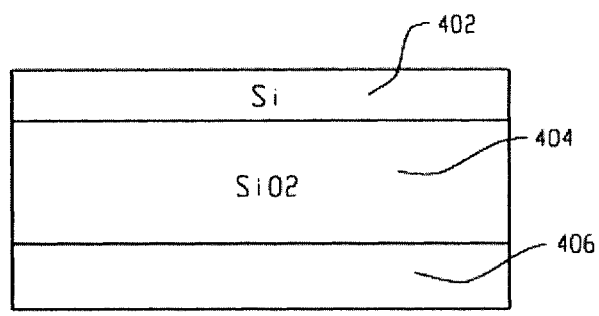
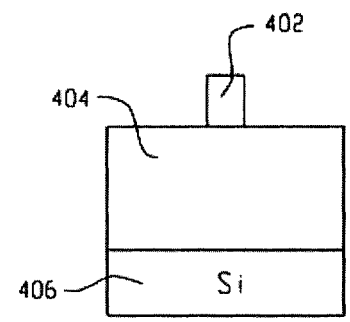
Fig. 4(A)  Fig. 4(B)
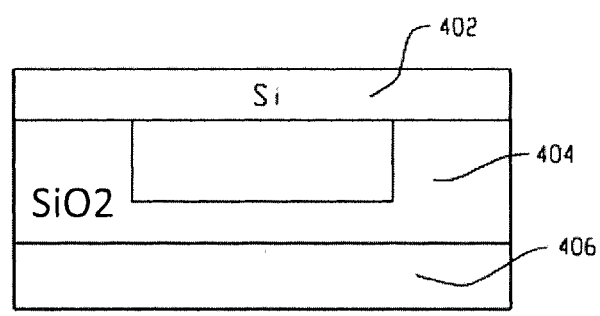
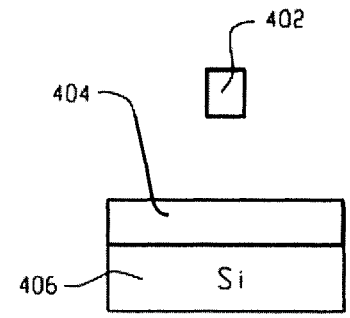
Fig. 4(C)  Fig. 4(D)

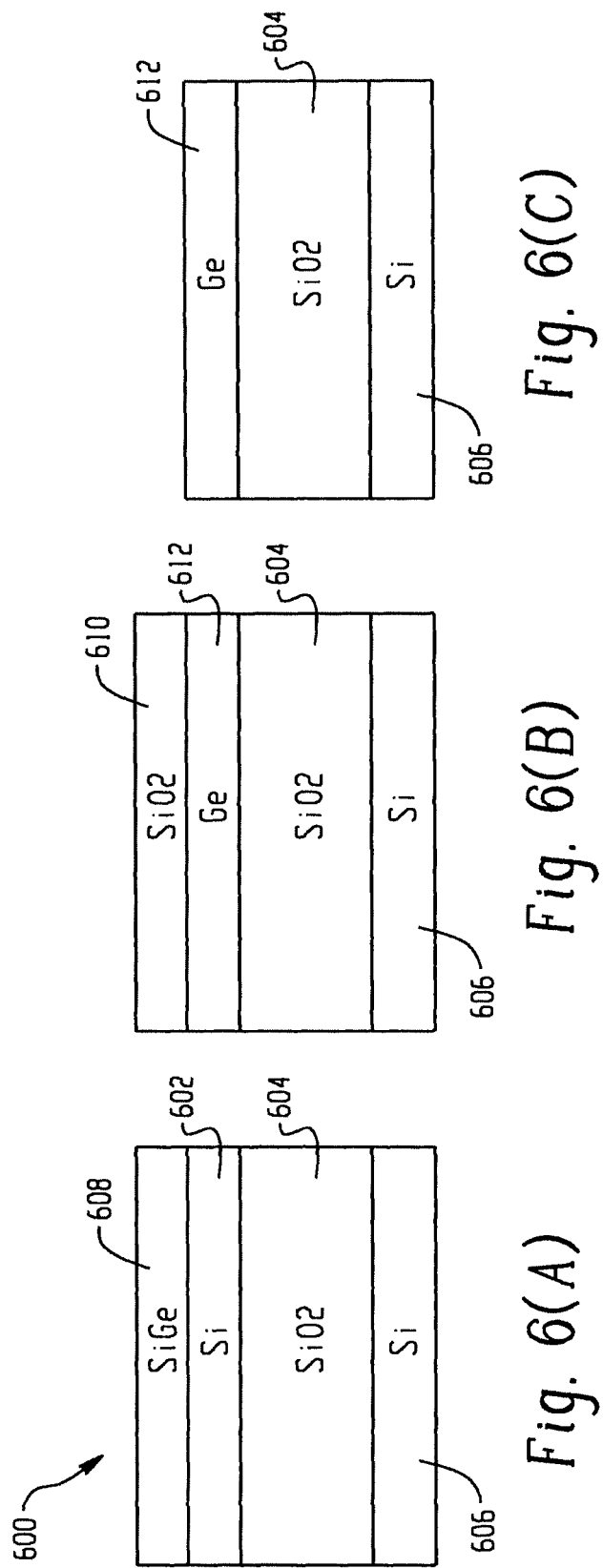

SEMICONDUCTOR DEVICES WITH CORE-SHELL STRUCTURES

RELATED APPLICATION

This application is a Divisional Application of U.S. patent application Ser. No. 14/211,382 filed Mar. 14, 2014, the entire content of which is incorporated herein by reference.

BACKGROUND

The technology described in this disclosure relates generally to semiconductor devices and more particularly to fabrication of semiconductor devices.

Traditional planar devices often have limitations in terms of miniaturization and choices of suitable materials. As feature sizes of semiconductor devices continue to shrink (e.g., into a sub 50 nm regime), various problems, such as short-channel effects and poor sub-threshold characteristics, often become severe in traditional planar devices. Novel device geometries with enhanced performance, such as three-dimensional device structures (e.g., FinFETs) and hetero-integration of different high-mobility channels for N-MOS and P-MOS devices, have been explored to push toward higher packing densities in devices and circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1(A)-FIG. 1(C) depict example diagrams showing a horizontal nanowire transistor structure, in accordance with some embodiments.

FIG. 4(A)-FIG. 4(D) depict example diagrams showing a process for fabricating horizontal core structures on a silicon-on-insulator (SOI) wafer, in accordance with some embodiments.

FIG. 6(A)-FIG. 7(F) depict example diagrams showing another process for fabricating a horizontal core-shell structure on a SOI wafer, in accordance with some embodiments.

DETAILED DESCRIPTION

Figure 2A:
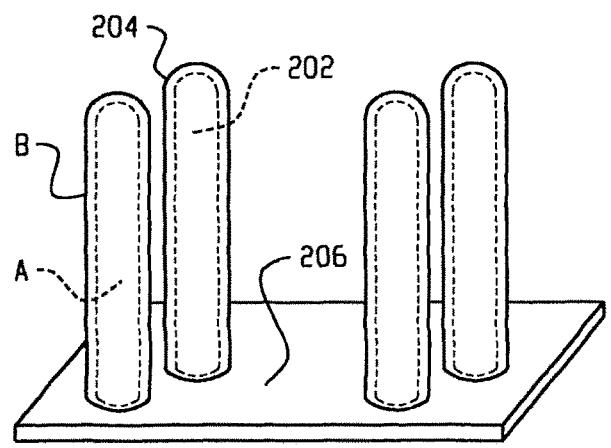
FIG. 2(A)-FIG. 2(B) depict example diagrams showing vertical nanowire transistor structures, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "under" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The development of nanotechnology and the emerging ability of producing nanowires have opened up new possibilities for designing next-generation semiconductor devices, such as horizontal nanowire devices and vertical nanowire devices with core-shell structures.

FIG. 1(A)-FIG. 1(C) depict example diagrams showing a horizontal nanowire transistor structure, in accordance with some embodiments. As shown in FIG. 1(A), the horizontal nanowire transistor structure 100 includes a core structure 102 (e.g., A) and a shell material 104 (e.g., B) formed on the core structure 102. The shell material 104 that surrounds at least part of the core structure 102 serves as a channel region (e.g., a quantum-well channel) of the nanowire transistor structure 100, and the core structure 102 serves as a barrier region. For example, the shell material 104 is configured to conduct a current flowing between a source region (not shown) and a drain region (not shown) and include an inversion layer or an accumulation layer. In addition, the nanowire transistor structure 100 includes spacers 106 (e.g., silicon nitride, silicon oxide) and an inter-layer dielectric (ILD) material (e.g., silicon oxide). The core structure 102 extends through the spacers 106 and is supported by a material 110 (e.g., silicon oxide, germanium, silicon germanium).

FIG. 1(B) shows a cross-sectional view of the nanowire transistor structure 100, and FIG. 1(C) shows another cross-sectional view of the nanowire transistor structure 100 along a cutline C as shown in FIG. 1(B). As shown in FIG. 1(C), the nanowire transistor structure 100 is formed on a support structure 114 (e.g., a silicon substrate, a silicon-on-oxide wafer). A shallow-trench-isolation (STI) structure 112 surrounds the material 110. In some embodiments, the STI structure 112 is formed using certain processes. For example, a dry etching process (e.g., reactive ion etch) is performed to form trenches in the support structure 114, and the trenches are then filled with dielectric materials through deposition followed by a chemical-mechanical polishing process. The dielectric materials may be further removed through etching to form the STI structure 112.

Figure 2B:
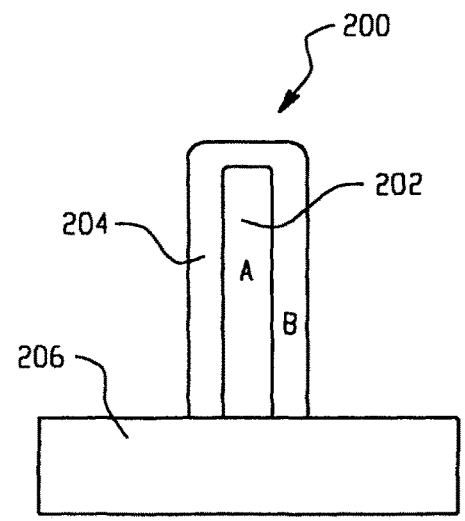

FIG. 2(A)-FIG. 2(B) depict example diagrams showing vertical nanowire transistor structures, in accordance with some embodiments. As shown in FIG. 2(A) and FIG. 2(B), a vertical nanowire transistor structure 200 includes a core structure 202 (e.g., A) and a shell material 204 (e.g., B) formed on the core structure 202. The shell material 204 that surrounds at least part of the core structure 202 serves as a channel region (e.g., a quantum-well channel) of the nanowire transistor structure 200, and the core structure 202 serves as a barrier region. For example, the shell material 204 is configured to conduct a current flowing between a source region (not shown) and a drain region (not shown) and include an inversion layer or an accumulation layer. FIG. 2(B) shows a cross-sectional view of the nanowire transistor structure 200. The core structure 202 and the shell material 204 are formed on a support structure 206.

In some embodiments, the shell material 104 (or the shell material 204) is associated with a first lattice constant and a first bandgap, and the core structure 102 (or the core structure 202) is associated with a second lattice constant and a second bandgap. The first bandgap is smaller than the second bandgap, and the first lattice constant is larger than the second lattice constant. For example, the first lattice constant is about 1% to about 8% larger than the second lattice constant. The lattice mismatch strain may be distributed through the shell material 104 (or the shell material 204) and the core structure 102 (or the core structure 202) without generating many dislocations.

In certain embodiments, the shell material 104 (or the shell material 204) has a thickness in a range of about 2 nm to about 15 nm, and the core structure 102 (or the core structure 202) has a diameter in a range of about 3 nm to about 15 nm. For example, the core structure 102 (or the core structure 202) has a lower thickness limit for quantum-channel confinement (e.g., preventing tunneling and/or scattering), and has an upper thickness limit to reduce dislocations generated from the lattice mismatch between the core structure 102 (or the core structure 202) and the shell material 104 (or the shell material 204). As an example, the shell material 104 (or the shell material 204) has a lower thickness limit for conducting a current (e.g., including an inversion layer or an accumulation layer), and has an upper thickness limit for reducing dislocations caused by the lattice mismatch between the core structure 102 (or the core structure 202) and the shell material 104 (or the shell material 204). The shell material 104 (or the shell material 204) may have a thickness no larger than about ⅓ of a gate length (e.g., the gate length being smaller than or equal to 50 nm) of a transistor fabricated from the nanowire transistor structure 100 (or the nanowire transistor structure 200). For example, the radius of the core structure 102 (or the core structure 202) is controlled within a particular range to provide more flexibility for the thickness of the shell material 104 (or the shell material 204).

In some embodiments, the shell material 104 (or the shell material 204) includes silicon, silicon germanium, germanium, III-V materials (e.g., indium gallium arsenide) or other suitable materials. The core structure 102 (or the core structure 202) includes silicon, silicon germanium, germanium, or other suitable materials. The core structure 102 (or the core structure 202) and the shell material 104 (or the shell material 204) may have different conductivity types (e.g., different types of dopants). For example, the core structure 102 (or the core structure 202) is undoped or doped with p-type dopants up to $1\times10^{20}/cm^3$, and the shell material 104 (or the shell material 204) is undoped or doped with n-type dopants up to $1\times10^{20}/cm^3$. In another example, the core structure 102 (or the core structure 202) is undoped or doped with n-type dopants up to $1\times10^{20}/cm^3$, and the shell material 104 (or the shell material 204) is undoped or doped with p-type dopants up to $1\times10^{20}/cm^3$.

Figure 3A:
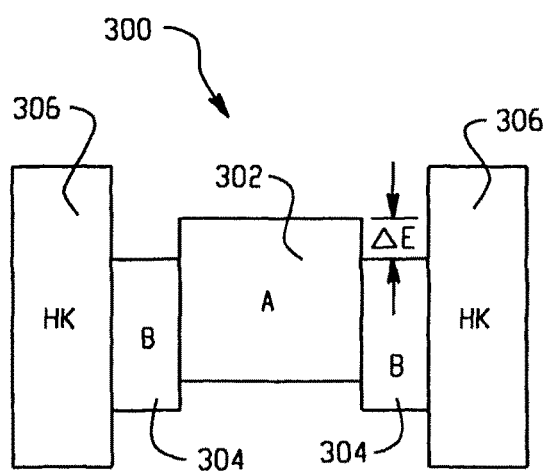
FIG. 3(A) and FIG. 3(B) depict example diagrams showing a band diagram for a n-type transistor and a band diagram for a p-type transistor respectively, in accordance with some embodiments.
Figure 3B:
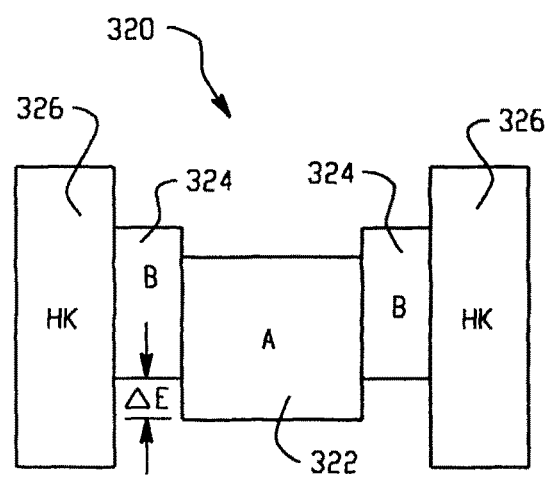

FIG. 3(A) and FIG. 3(B) depict example diagrams showing a band gap vs. channel cross section thickness plot diagram 300 for a n-type transistor and a band diagram 320 for a p-type transistor respectively, in accordance with some embodiments. As shown in FIG. 3(A), a barrier is formed at the interface of the bandgap (A) 302 of a core structure, and a bandgap (B) 304 of a shell material. The shell material surrounds at least part of the core structure, and serves as a channel region (e.g., a quantum-well channel) of the n-type transistor. As further shown in FIG. 3(A), a bandgap (HK) 306 of a wrapping material (e.g., a dielectric material) that is formed on the shell material and that surrounds at least part of the shell material is larger than the bandgap (A) 302, and the bandgap (B) 304. For example, the barrier height (e.g., $\Delta E$) is in a range of about 0.3 eV to about 0.5 eV. For example, the wrapping material serves as a gate dielectric of the n-type transistor.

As shown in FIG. 3(B), a barrier is formed at the interface of a bandgap (A) 322 of a core structure, and a bandgap (B) 324 of a shell material. The shell material surrounds at least part of the core structure, and serves as a channel region (e.g., a quantum-well channel) of the p-type transistor. As further shown in FIG. 3(B), a bandgap (HK) 326 of a wrapping material (e.g., a dielectric material) that is formed on the shell material and that surrounds at least part of the shell material is larger than the bandgap (A) 322 and the bandgap (B) 324. For example, the barrier height (e.g., $\Delta E$) is in a range of about 0.3 eV to about 0.5 eV. As an example, the wrapping material serves as a gate dielectric of the p-type transistor. In some embodiments, the wrapping material of the n-type transistor and the wrapping material of the p-type transistor include a high-k material, such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, or other suitable materials.

FIG. 4(A)-FIG. 4(D) depict example diagrams showing a process for fabricating horizontal core structures on a silicon-on-insulator (SOI) wafer, in accordance with some embodiments. The SOI wafer includes a silicon layer 402 on a buried silicon oxide layer 404 that is formed on a silicon substrate 406. The silicon layer 402 is patterned (e.g., through lithography and etching). For example, a reactive ion etching is performed to remove part of the silicon layer 402. FIG. 4(B) shows a cross-sectional view of the SOI wafer including the patterned silicon layer 402. An etching process (e.g., selective etching or isotropic etching) is performed on the SOI wafer. Part of the silicon oxide layer 404 is removed under the silicon layer 402, which results in one or more nanowire structures suspending above part of the recessed silicon oxide layer 404, as shown in FIG. 4(C). FIG. 4(D) shows a cross-sectional view of one of the horizontal nanowire structures. For example, the etching process is performed using a diluted hydrofluoric acid at room temperature. The nanowire structures may be further annealed (e.g., at a temperature in a range of about 600° C. to about 1000° C.) to form one or more horizontal core structures (e.g., the core structure 102). Furthermore, the nanowire structures may be oxidized and etched to achieve a desired diameter of the horizontal core structures (e.g., the core structure 102). For example, the formed core structures are substantially parallel to the silicon substrate 406, and are elliptical shaped or cylindrical shaped.

Figure 5A:
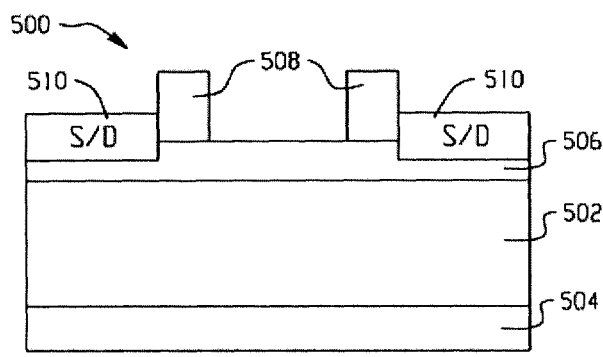
FIG. 5(A)-FIG. 5(F) depict example diagrams showing a process for fabricating a transistor structure including a horizontal core-shell structure, in accordance with some embodiments.

FIG. 5(A)-FIG. 5(F) depict example diagrams showing a process for fabricating a transistor structure including a horizontal core-shell structure, in accordance with some embodiments. As shown in FIG. 5(A), a wafer 500 includes a first material 502 formed (e.g., through epitaxial growth) on a support structure 504 (e.g., silicon substrate) and a second material 506 formed (e.g., through epitaxial growth) on the first material 502. For example, the first material 502 and the second material 506 include silicon germanium with different germanium concentration. In another example, the second material 506 includes silicon. Spacers 508 (e.g., silicon nitride), and source/drain regions 510 are formed on the second material 506. In some embodiments, a dielectric material (e.g., silicon oxide) may be formed on the source/drain regions 510.

Figure 5B:
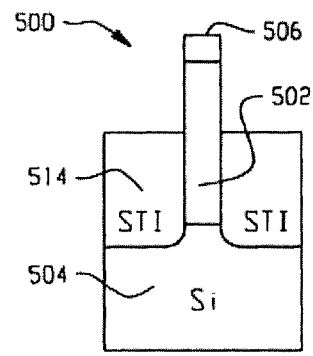
Figure 5C:
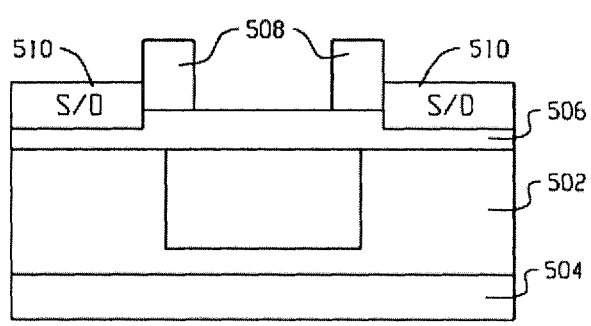
Figure 5D:
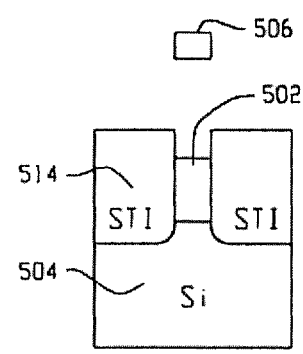
Figure 5E:
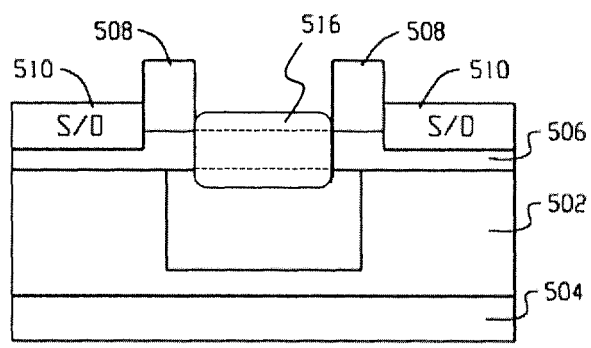
Figure 5F:
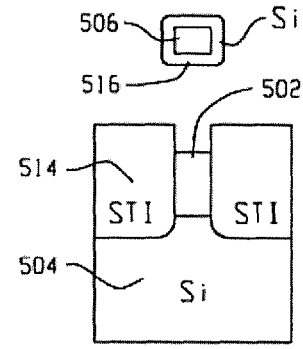

FIG. 5(B) shows a cross-sectional view of the wafer 500. One or more separation structures 514 (e.g., shallow-trench-isolation structures) are formed (e.g., adjacent to the first material 502) on the support structure 504. An etching process (e.g., selective etching or isotropic etching) is performed on the wafer 500. Part of the first material 502 is removed under the second material 506, which results in one or more nanowire structures suspending above part of the first material 502, as shown in FIG. 5(C). FIG. 5(D) shows a cross-sectional view of one of the horizontal nanowire structures. The nanowire structures may be further annealed (e.g., at a temperature in a range of about 600° C. to about 1000° C.) to form one or more horizontal core structures (e.g., the core structure 102). The nanowire structures may be oxidized and etched to achieve a desired diameter of the horizontal core structures (e.g., the core structure 102). In addition, a shell material 516 (e.g., the shell material 104) is formed (e.g., through epitaxial growth) on the horizontal core structures generated from the second material 506, as shown in FIG. 5(E). FIG. 5(F) shows a cross-sectional view of the transistor structure including the core-shell structure as shown in FIG. 5(E).

FIG. 6(A)-FIG. 7(F) depict example diagrams showing another process for fabricating a horizontal core-shell structure on a SOI wafer, in accordance with some embodiments. As shown in FIG. 6(A), the SOI wafer 600 includes a silicon layer 602 on a buried silicon oxide layer 604 that is formed on a silicon substrate 606. A silicon germanium layer 608 is formed on the silicon layer 602.

A condensation process is performed on the SOI wafer 600, e.g., at a temperature between about 850° C. and about 1100° C. in an oxygen-containing environment (e.g., in an oven). During the condensation process, germanium atoms in the silicon germanium layer 608 migrate inwardly to form a germanium-containing material 612. For example, the germanium-containing material 612 includes a high percentage of germanium (e.g., close to 100%). A silicon oxide layer 610 is formed on the germanium-containing material 612 due to the condensation process, as shown in FIG. 6(B). Then, the silicon oxide layer 610 is removed (e.g., through etching), as shown in FIG. 6(C).

Figure 7A:
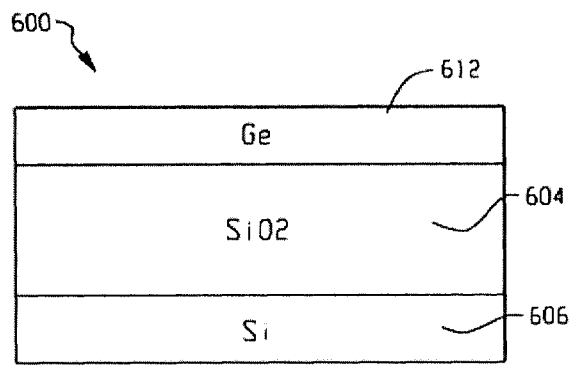
Figure 7B:
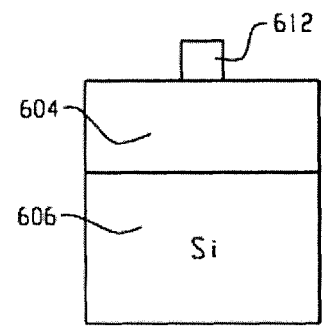
Figure 7C:
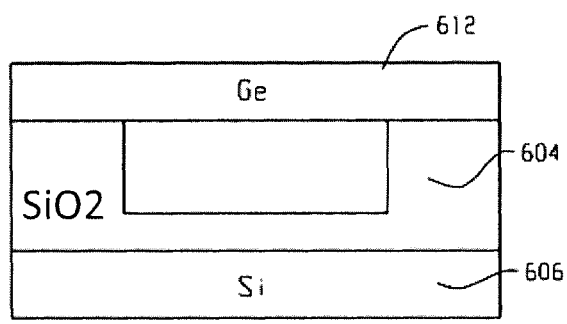
Figure 7D:
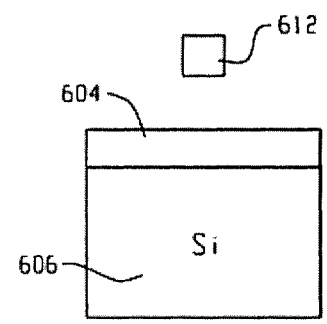
Figure 7E:
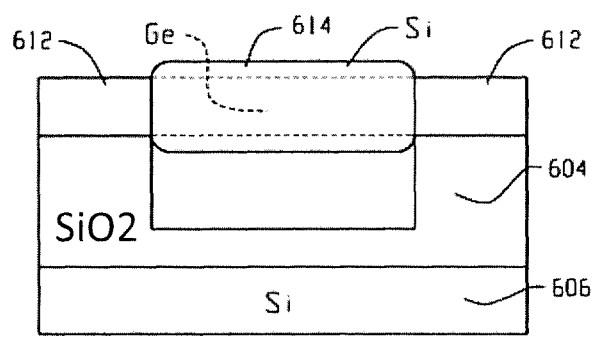
Figure 7F:
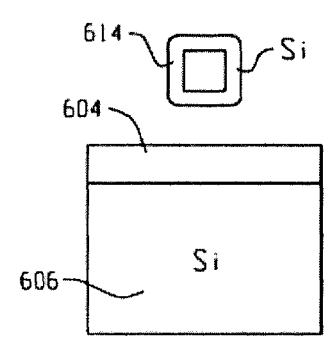

The germanium-containing material 612 is patterned (e.g., through lithography and etching), as shown in FIG. 7(A). FIG. 7(B) shows a cross-sectional view of the SOI wafer 600 including the germanium-containing material 612. An etching process (e.g., selective etching or isotropic etching) is performed on the SOI wafer 600. Part of the silicon oxide layer 604 is removed under the germanium-containing material 612, which results in one or more nanowire structures suspending above part of the recessed silicon oxide layer 604, as shown in FIG. 7(C). FIG. 7(D) shows a cross-sectional view of one of the horizontal nanowire structures. The nanowire structures may be further annealed (e.g., at a temperature in a range of about 600° C. to about 1000° C.) to form one or more horizontal core structures (e.g., the core structure 102). The nanowire structures may be oxidized and etched to achieve a desired diameter of the horizontal core structures (e.g., the core structure 102). Furthermore, a shell material 614 (e.g., the shell material 104) is formed (e.g., through epitaxial growth) on the horizontal core structures generated from the germanium-containing material 612, as shown in FIG. 7(E). FIG. 7(F) shows a cross-sectional view of the horizontal core-shell structure as shown in FIG. 7(E).

Figure 8C:
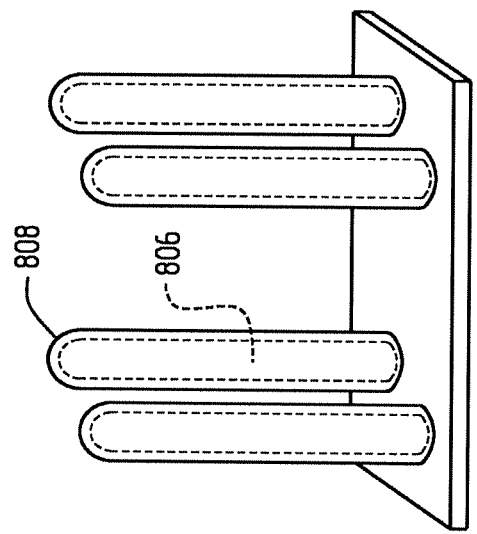
FIG. 8(A)-FIG. 8(C) depict example diagrams showing a process for fabricating vertical core-shell structures, in accordance with some embodiments.
Figure 8B:
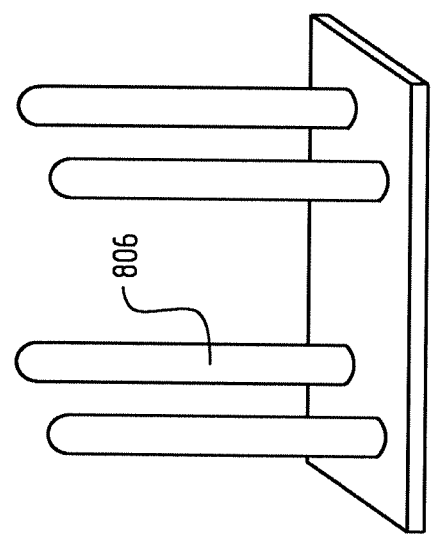
Figure 8A:
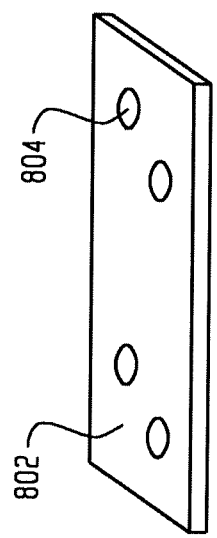

FIG. 8(A)-FIG. 8(C) depict example diagrams showing a process for fabricating vertical core-shell structures, in accordance with some embodiments. Vertical core-shell structures may be grown on a support structure 802 (e.g., a silicon substrate). As shown in FIG. 8(A), a first material 804 (e.g., silicon oxide) is patterned on the support structure 802. One or more vertical nanowire structures are selectively and directionally formed (e.g., through epitaxial growth) on the patterned first material 804. The nanowire structures may be further annealed (e.g., at a temperature in a range of about 600° C. to about 1000° C.) to form one or more vertical core structures 806 (e.g., the core structure 202), as shown in FIG. 8(B). The nanowire structures may be oxidized and etched to achieve a desired diameter of the vertical core structures 806. Furthermore, a shell material 808 (e.g., the shell material 204) is formed (e.g., through epitaxial growth) on the vertical core structures 806, as shown in FIG. 8(C). As an example, the support structure 802 has a crystalline orientation (1 1 1). For example, the vertical core structures 806 are substantially perpendicular to the support structure 802.

Figure 9C:
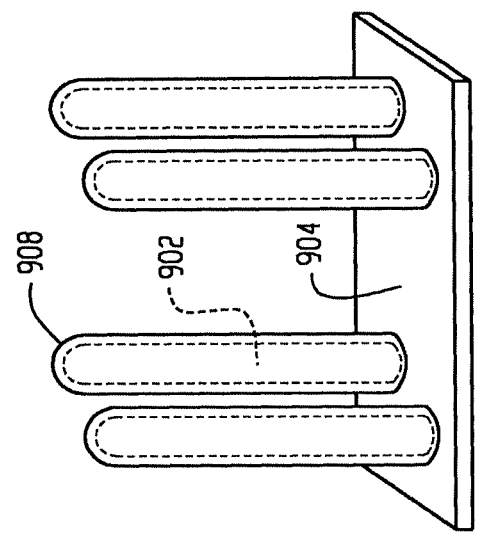
FIG. 9(A)-FIG. 9(C) depict example diagrams showing another process for fabricating vertical core-shell structures, in accordance with some embodiments.
Figure 9B:
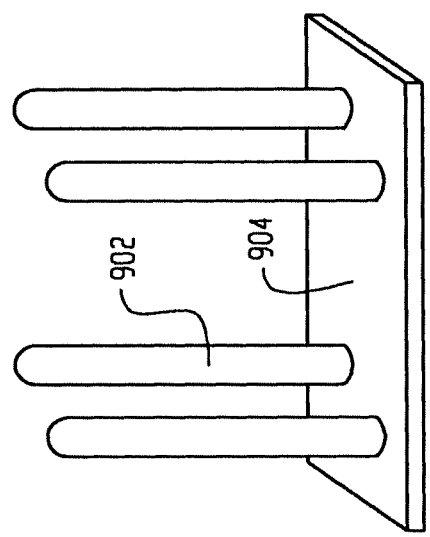
Figure 9A:
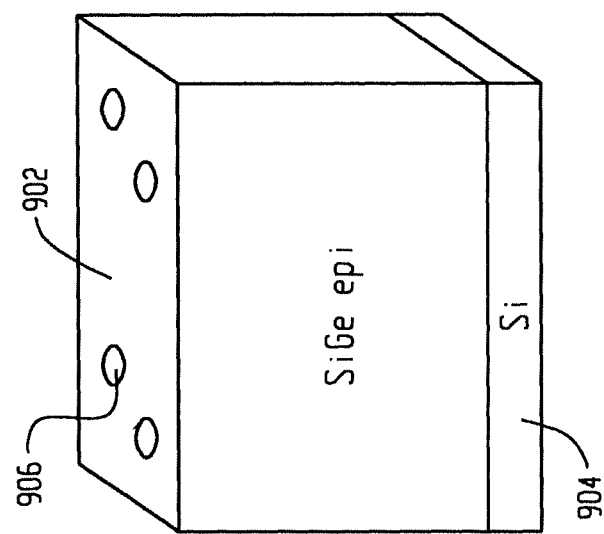

FIG. 9(A)-FIG. 9(C) depict example diagrams showing another process for fabricating vertical core-shell structures, in accordance with some embodiments. As shown in FIG. 9(A), a first material 902 (e.g., silicon germanium) is formed on a support structure 904. A mask layer 906 is foil red on the first material 902 and is then patterned through, e.g., lithography and etching. For example, a photoresist layer is formed on the mask layer 906 and exposed to a desired pattern of radiation. Then, the photoresist layer is developed using a resist developer. The pattern within the photoresist layer is transferred through the mask layer 906 and into the underlying first material 902. A single etch (e.g., dry etch or wet etch) or multiple etching can be used for transferring the pattern through the mask layer 906 and into the underlying first material 902, and then the mask layer 906 is removed (e.g., through a chemical-mechanical planarization process) to form one or more vertical nanowire structures. The nanowire structures may be further annealed (e.g., at a temperature in a range of about 600° C. to about 1000° C.) to form one or more vertical core structures 906 (e.g., the core structure 202), as shown in FIG. 9(B). The nanowire structures may be oxidized and etched to achieve a desired diameter of the vertical core structures 902. For example, the vertical core structure 902 are substantially perpendicular to the support structure 904 and are elliptical shaped or cylindrical shaped. Furthermore, a shell material 908 (e.g., the shell material 204) is formed (e.g., through epitaxial growth) on the vertical core structures 902, as shown in FIG. 9(C).

Figure 10:
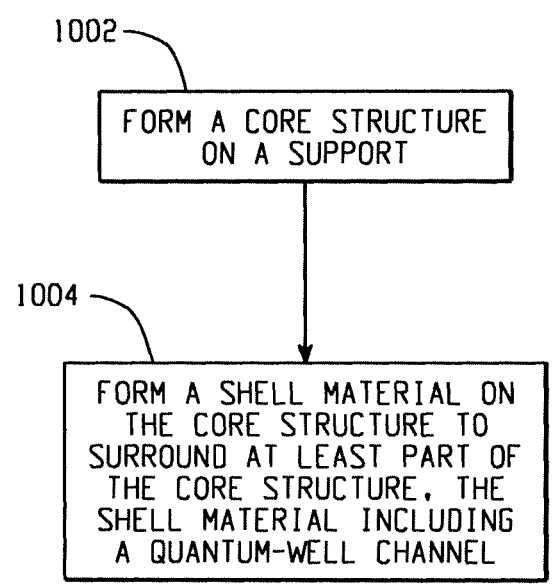
FIG. 10 depicts an example flow chart for fabricating a device structure including a core-shell structure, in accordance with some embodiments.

FIG. 10 depicts an example flow chart for fabricating a device structure including a core-shell structure, in accordance with some embodiments. At 1002, a core structure is formed on a support (e.g., a substrate). At 1004, a shell material is formed on the core structure to surround at least part of the core structure. The shell material includes a quantum-well channel. For example, the core structure and the shell material are formed through chemical vapor deposition (CVD), plasma enhanced chemical vapor deposition (PECVD), physical vapor deposition (PVD), sputtering, atomic layer deposition (ALD), or other suitable processes.

According to one embodiment, a device structure includes: a core structure formed on a support, and a shell material formed on the core structure and surrounding at least part of the core structure. The shell material and the core structure are configured to form a quantum-well channel in the shell material.

According to another embodiment, a method is provided for forming a core-shell device structure. A core structure is formed on a support. A shell material is formed on the core structure to surround at least part of the core structure, the shell material including a quantum-well channel.

According to yet another embodiment, a transistor includes: a source region, a drain region, and a nanowire structure including a core structure and a shell material surrounding at least part of the core structure. The shell material and the core structure are configured to form a quantum-well channel in the shell material to conduct a current between the source region and the drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first material layer over a substrate;
    forming a semiconductor layer made of a first semiconductor material over the first material layer;
    patterning the semiconductor layer and the first material layer, thereby forming a patterned layer including a patterned semiconductor layer and a patterned first material layer;
    forming an isolation insulating layer on side faces of the patterned first material layer of the patterned layer such that an uppermost surface of the isolation insulating layer is below a bottom surface of the patterned semiconductor layer of the patterned layer;
    after the isolation insulating layer is formed, removing a part of the patterned first material layer under a part of the patterned semiconductor layer, thereby forming a semiconductor wire; and
    forming a semiconductor shell layer made of a second semiconductor material different from the first semiconductor material around the semiconductor wire,
    wherein in the patterning the semiconductor layer and the first material layer, a part of the substrate is etched.

2. The method of claim 1, wherein the first semiconductor material includes at least one of silicon, silicon germanium and germanium.

3. The method of claim 2, wherein the second semiconductor material includes at least one of silicon, silicon germanium, germanium and a III-V material.

4. The method of claim 1, further comprising, before removing a part of the patterned first material layer, forming insulating spacers over the semiconductor layer.

5. The method of claim 4, further comprising, before removing a part of the patterned first material layer, forming a source/drain structure over a thin portion of the semiconductor layer having a smaller thickness than a portion of the semiconductor layer under the insulating spacers.

6. The method of claim 5, wherein a bottom surface of the source/drain structure is lower than a top surface of the patterned semiconductor layer and above the bottom surface of the patterned semiconductor layer, before removing a part of the patterned first material layer.

7. The method of claim 1, wherein:
    the semiconductor wire has a first conductivity type, and
    the semiconductor shell layer has a second conductivity type different from the first conductivity type.

8. The method of claim 1, wherein the semiconductor shell layer includes a Group III-V semiconductor material and has a thickness of about 2 nm to about 15 nm.

9. The method of claim 1, wherein the semiconductor wire includes at least one of silicon and germanium and has a thickness of about 3 nm to about 15 nm.

10. The method of claim 1, wherein the first material layer includes a third semiconductor material different from the first semiconductor material.

11. The method of claim 10, wherein the first semiconductor material and the third semiconductor material are made of germanium and germanium with different germanium concentration.

12. The method of claim 1, further comprising annealing the semiconductor wire at a temperature in a range from 600° C. to 1000° C.

13. The method of claim 1, further comprising thinning the semiconductor wire by oxidization and etching.

14. A method of manufacturing a semiconductor device, the method comprising:
    forming a semiconductor fin structure over a substrate, wherein the semiconductor fin structure has a width smaller than a height, and includes a support layer disposed on a protrusion protruding from the substrate, and a wire layer made of a first semiconductor material disposed on the support layer;
    forming insulating spacers over the wire layer;
    forming a source/drain region over the wire layer, wherein a bottom surface of the source/drain region is lower than a top surface of the wire layer and above a bottom surface of the wire layer;
    after the insulating spacers and the source/drain region are formed, forming a recess by removing a part of the support layer under a part of the wire layer, thereby forming a suspending semiconductor wire, of which ends are supported by the support layer; and
    forming a semiconductor shell layer made of a second semiconductor material different from the first semiconductor material around the suspending semiconductor wire,
    wherein the semiconductor shell layer is in direct contact with the insulating spacers.

15. The method of claim 14, wherein the insulating spacers are disposed over the suspending semiconductor wire without interposing the semiconductor shell layer.

16. The method of claim 14, wherein the source/drain region is formed on a thin portion of the wire layer having a smaller thickness than a portion of the wire layer under the insulating spacers.

17. The method of claim 14, wherein a contact portion of an edge of the recess and a bottom surface of the suspending semiconductor wire is located under a part of one of the insulating spacers between two edges of the one of the insulating spacers.

18. A method of manufacturing a semiconductor device, the method comprising:

forming a semiconductor fin structure having a width smaller than a height and including a support layer and a wire layer made of a first semiconductor material;

forming an isolation insulating material on sides of a bottom part of the support layer such that an upper surface of the isolation insulating material is below a bottom surface of the wire layer;

after the isolation insulating material is formed, forming a recess by removing a part of the support layer under a part of the wire layer to a level below the upper surface of the isolation insulating material, thereby forming a suspending semiconductor wire, of which ends are supported by the support layer; and forming a semiconductor shell layer made of a second semiconductor material different from the first semiconductor material around the suspending semiconductor wire, the support layer includes an upper support and a lower support made of different materials from each other, and the isolation insulating material physically contacts the upper support and the lower support.

19. The method of claim 18, wherein the upper support is made of silicon germanium and the lower support is made of silicon.

20. The method of claim 18, further comprising forming insulating spacers over the wire layer, wherein a contact portion of an edge of the recess and a bottom surface of the suspending semiconductor wire is located under a part of one of the insulating spacers between two edges of the one of the insulating spacers.

* * * * *